United States Patent
Mason et al.

(10) Patent No.: US 7,550,785 B1
(45) Date of Patent: Jun. 23, 2009

(54) PHEMT STRUCTURE HAVING RECESSED OHMIC CONTACT AND METHOD FOR FABRICATING SAME

(75) Inventors: Jerod F. Mason, Bedford, MA (US); Dylan C. Bartle, Arlington, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 11/293,348

(22) Filed: Dec. 2, 2005

(51) Int. Cl.
*H01L 29/08* (2006.01)

(52) U.S. Cl. .................. 257/194; 257/192; 257/195; 257/E27.012

(58) Field of Classification Search .......... 257/194, 257/195, E27.012, 192
See application file for complete search history.

(56) References Cited

U.S. PATENT DOCUMENTS

| | | | |
|---|---|---|---|
| 5,140,386 A | | 8/1992 | Huang et al. |
| 5,324,682 A | * | 6/1994 | Tserng ................ 438/172 |
| 5,844,261 A | * | 12/1998 | Kuo et al. .............. 257/194 |
| 6,020,226 A | * | 2/2000 | Cerny et al. ............ 438/167 |
| 7,285,807 B2 | * | 10/2007 | Brar et al. .............. 257/194 |
| 2001/0024846 A1 | * | 9/2001 | Yamaguchi et al. ...... 438/191 |

* cited by examiner

*Primary Examiner*—Kiesha L Rose
*Assistant Examiner*—Minchul Yang
(74) *Attorney, Agent, or Firm*—Lowrie, Lando & Anastasi, LLP

(57) ABSTRACT

According to an exemplary embodiment, a PHEMT (pseudomorphic high electron mobility transistor) structure includes a conductive channel layer. The PHEMT structure further includes at least one doped layer situated over the conductive channel layer. The at least one doped layer can include a heavily doped layer situated over a lightly doped layer. The PHEMT structure further includes a recessed ohmic contact situated on the conductive channel layer, where the recessed ohmic contact is situated in a source/drain region of the PHEMT structure, and where the recessed ohmic contact extends below the at least one doped layer. According to this exemplary embodiment, the recessed ohmic contact is bonded to the conductive channel layer. The recessed ohmic contact is situated adjacent to the at least one doped layer. The PHEMT structure further includes a spacer layer situated between the at least one doped layer and the conductive channel layer.

16 Claims, 5 Drawing Sheets

PHEMT STRUCTURE HAVING RECESSED OHMIC CONTACT AND METHOD FOR FABRICATING SAME

BACKGROUND OF THE INVENTION

1. Field of the Invention

The present invention is generally in the field of semiconductors. More specifically, the invention is in the field of pseudomorphic high electron mobility transistor structures.

2. Background Art

In many applications, it is desirable to reduce the "on-state" resistance of transistors, such as field effect transistors (FETs) and, more particularly, pseudomorphic high electron mobility transistors (PHEMTs), without compromising performance or reliability. By way of background, the on-state resistance of a PHEMT refers to the source to drain resistance as measured while the PHEMT is in an operating state.

Various methods have been attempted in the art in an effort to reduce the on-state resistance of PHEMT structures. One method attempts to reduce gate length to achieve reduced on-state resistance. However, since gate length reduction is currently at the limits of process capabilities, new photolithography processes and equipment will be required to further reduce gate length. In another method, source to drain spacing is minimized to reduce on-state resistance. However, catastrophic gate to drain leakage can occur if source to drain spacing is reduced too much. In yet another method to reduce on-state resistance, thickness of the Schottky layer, which is typically situated above a highly conductive channel layer in the PHEMT structure, is increased. However, although providing a minimal reduction in on-state resistance, increasing Schottky layer thickness can have the undesirably effect of significantly decreasing pinch-off voltage.

Thus, there is a need in the art for a PHEMT structure which provides reduced on-state resistance without compromising performance or reliability.

SUMMARY OF THE INVENTION

The present invention is directed to a PHEMT structure having a recess ohmic contact and method for fabricating same. The present invention addresses and resolves the need in the art for a PHEMT structure which provides reduced on-state resistance without compromising performance or reliability.

According to an exemplary embodiment, a PHEMT (pseudomorphic high electron mobility transistor) structure includes a conductive channel layer. The conduct channel layer can be indium gallium arsenide, for example. The PHEMT structure further includes at least one doped layer situated over the conductive channel layer. The at least one doped layer can include a heavily doped layer situated over a lightly doped layer. For example, the at least one doped layer can be gallium arsenide. The PHEMT structure further includes a recessed ohmic contact situated on the conductive channel layer, where the recessed ohmic contact is situated in a source/drain region of the PHEMT structure, and where the recessed ohmic contact extends below the at least one doped layer.

According to this exemplary embodiment, the recessed ohmic contact is bonded to the conductive channel layer. The recessed ohmic contact is situated adjacent to the at least one doped layer. For example, the recessed ohmic contact can include gold, nickel, and germanium. The PHEMT structure further includes a spacer layer situated between the at least one doped layer and the conductive channel layer. The spacer layer can be aluminum gallium arsenide, for example. The spacer layer can be a Schottky layer, for example. In another embodiment, the present invention is a method that achieves the above-described recessed ohmic contact. Other features and advantages of the present invention will become more readily apparent to those of ordinary skill in the art after reviewing the following detailed description and accompanying drawings.

DETAILED DESCRIPTION OF THE INVENTION

The present invention is directed to a PHEMT structure having a recessed ohmic contact and method for fabricating same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which uses the principles of the present invention are not specifically described in the present application and are not specifically illustrated by the present drawings. It should be noted that similar numerals generally refer to similar elements in the various drawings.

Figure 1:
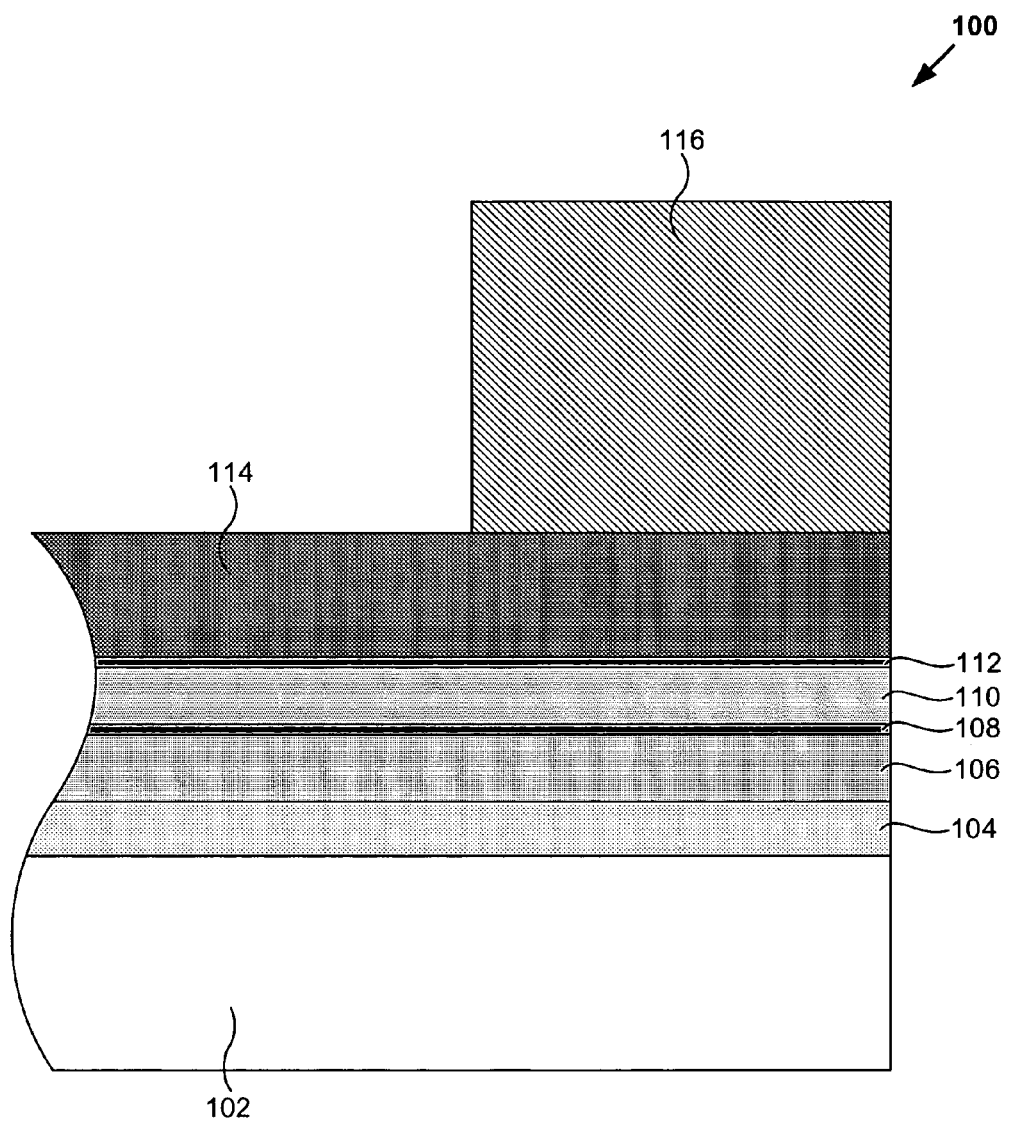
FIG. 1 illustrates a cross-sectional view of an exemplary pseudomorphic high electron mobility transistor structure including an exemplary conventional ohmic contact.

FIG. 1 shows a cross-sectional view of an exemplary known pseudomorphic high electron mobility transistor (PHEMT) structure. PHEMT structure 100 includes buffer layer 102, conductive channel layer 104, spacer layer 106, first etch stop layer 108, lightly doped layer 110, second etch stop layer 112, heavily doped layer 114, and ohmic contact 116. As shown in FIG. 1, buffer layer 102, which can be situated over a substrate (not shown in FIG. 1), can comprise, for example, gallium arsenide (GaAs) or a combination of GaAs and aluminum gallium arsenide (AlGaAs). Also shown in FIG. 1, conductive channel layer 104 is situated over buffer layer 102 and provides a region where electron mobility is highest. Conductive channel layer 104 can comprise, for example, indium gallium arsenide (InGaAs). Further shown in FIG. 1, spacer layer 106 is situated over conductive channel layer 104, can comprise, and can be a Schottky AlGaAs layer.

Also shown in FIG. 1, first etch stop layer 108 is situated over spacer layer 106 and can comprise, for example, aluminum arsenide (AlAs) or indium gallium phosphide (InGaP). Further shown in FIG. 1, lightly doped layer 110 is situated over first etch stop layer 108, and second etch stop layer 112 is situated over lightly doped layer 110. Lightly doped layer 110 can comprise, for example, lightly doped AlAs or InGaP and second etch stop layer 112 can comprise, for example, AlAs or InGaP. Further shown in FIG. 1, heavily doped layer 114 is situated over etch stop layer 112 and can comprise, for example, heavily doped GaAs. Also shown in FIG. 1, ohmic contact 116 is situated on and bonded to heavily doped layer 114 and can comprise a stack of metal layers. For example, ohmic contact 116 can comprise a stack of sequentially deposited layers of gold, nickel, germanium, and gold. Ohmic contact 116 can form either a source or drain contact for PHEMT structure 100.

When PHEMT structure 100 is in an operating state, the resistance caused by the layers between ohmic contact 116 and conductive layer 104, such as heavily doped layer 114, lightly doped layer 110, and spacer layer 106, can substantially increase the on-state resistance of PHEMT structure 100, which is undesirable.

Figure 2:
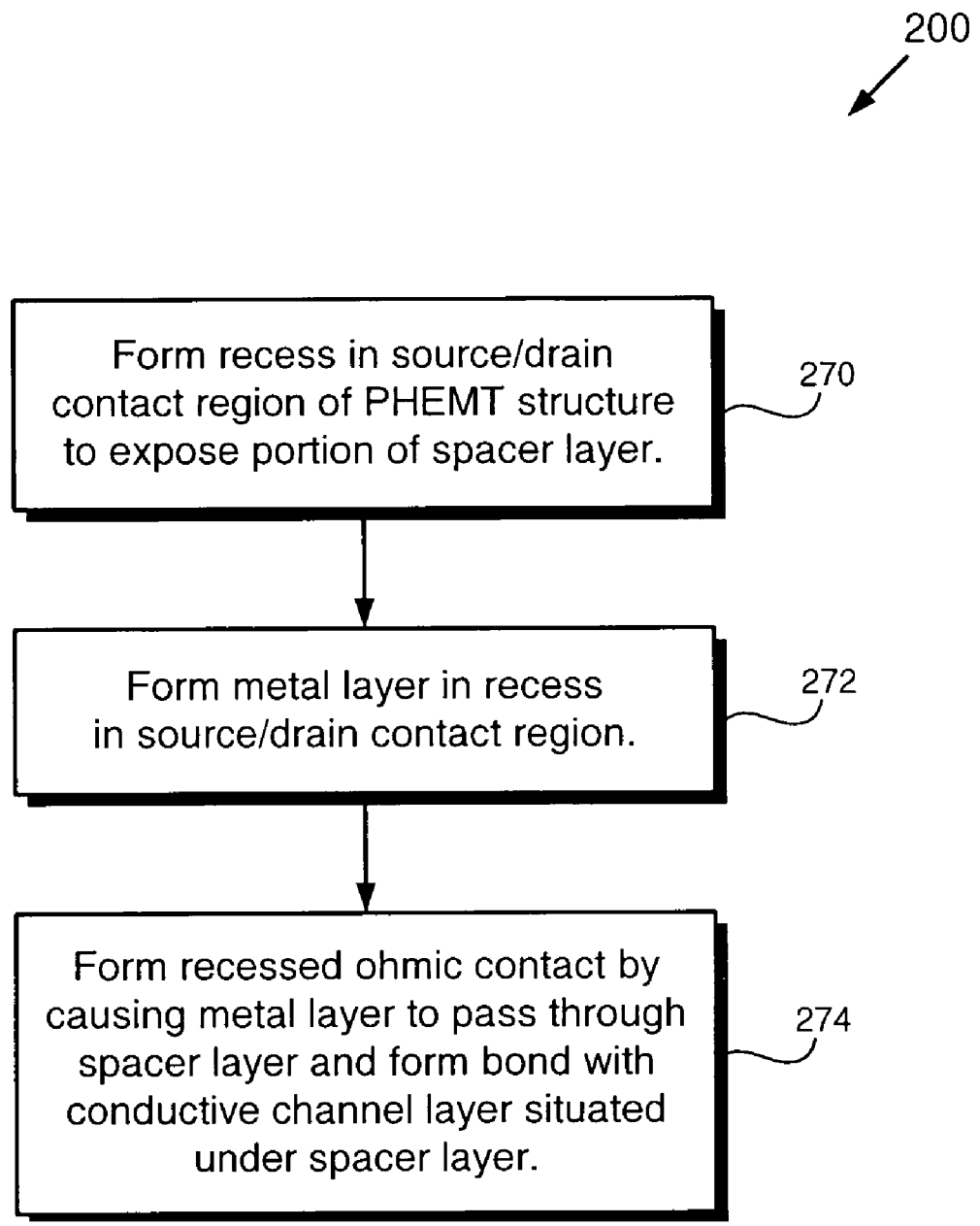
FIG. 2 shows a flowchart illustrating the steps taken to implement an embodiment of the present invention.

FIG. 2 shows flowchart 200, which illustrates an exemplary method according to one embodiment of the present invention. Certain details and features have been left out of flowchart 200 that are apparent to a person of ordinary skill in the art. For example, a step may consist of one or more substeps or may involve specialized equipment or materials, as known in the art. Steps 270 through 274 indicated in flowchart 200 are sufficient to describe one embodiment of the present invention, other embodiments of the invention may utilize steps different from those shown in flowchart 200.

Figure 3A:
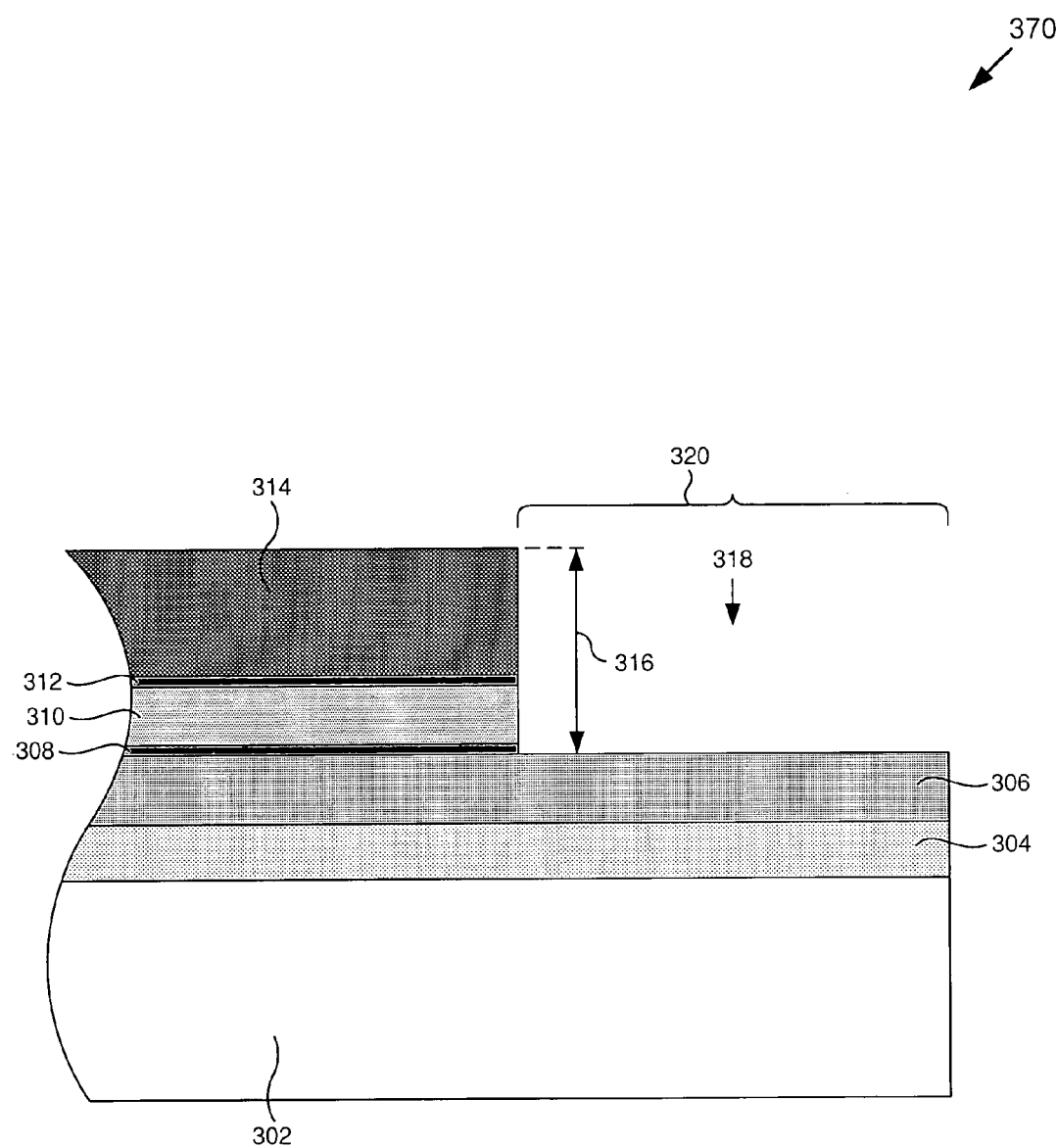
FIG. 3A illustrates a cross-sectional view, which includes a portion of a wafer processed according to an embodiment of the invention, corresponding to an initial step in the flowchart in FIG. 2.
Figure 3B:
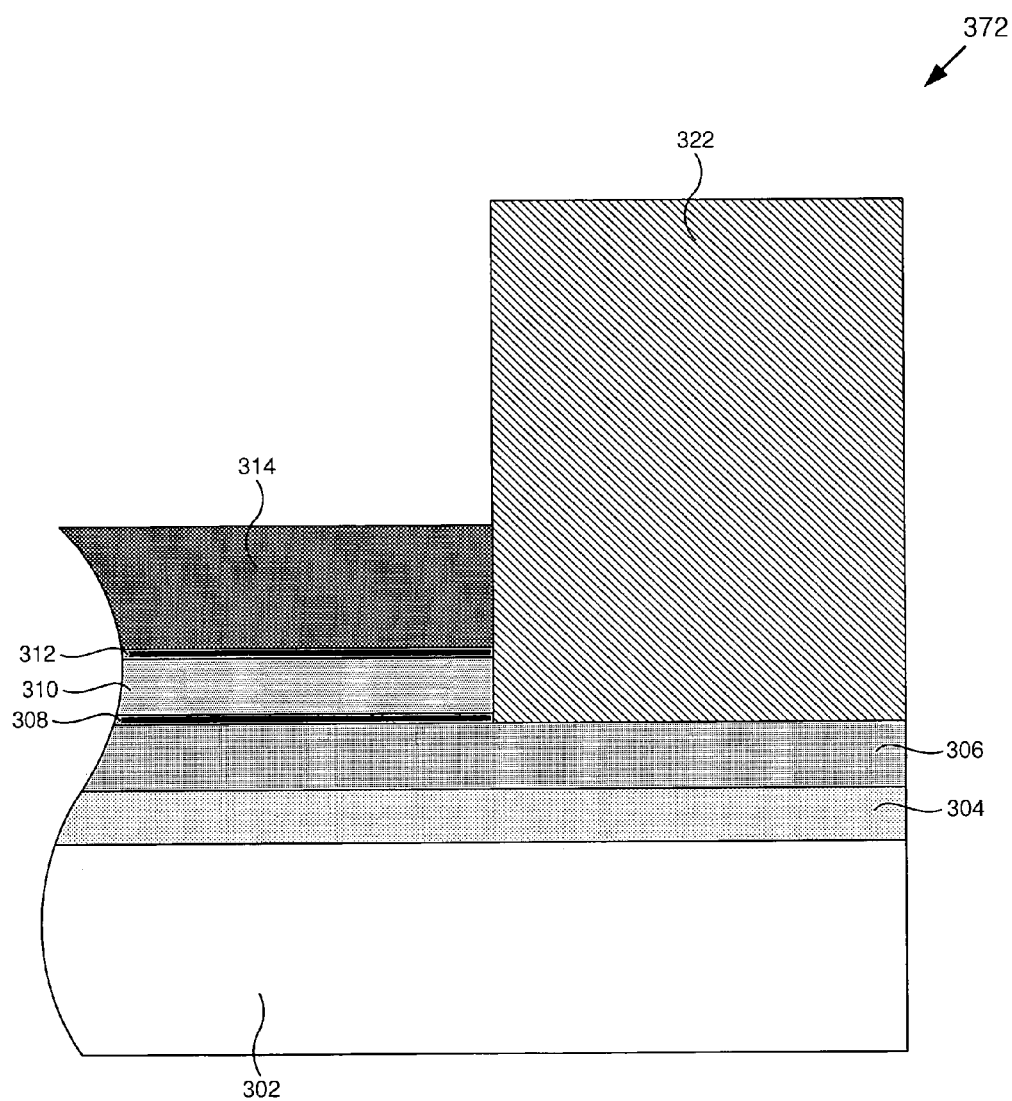
FIG. 3B illustrates a cross-sectional view, which includes a portion of a wafer processed according to an embodiment of the invention, corresponding to an intermediate step in the flowchart in FIG. 2.
Figure 3C:
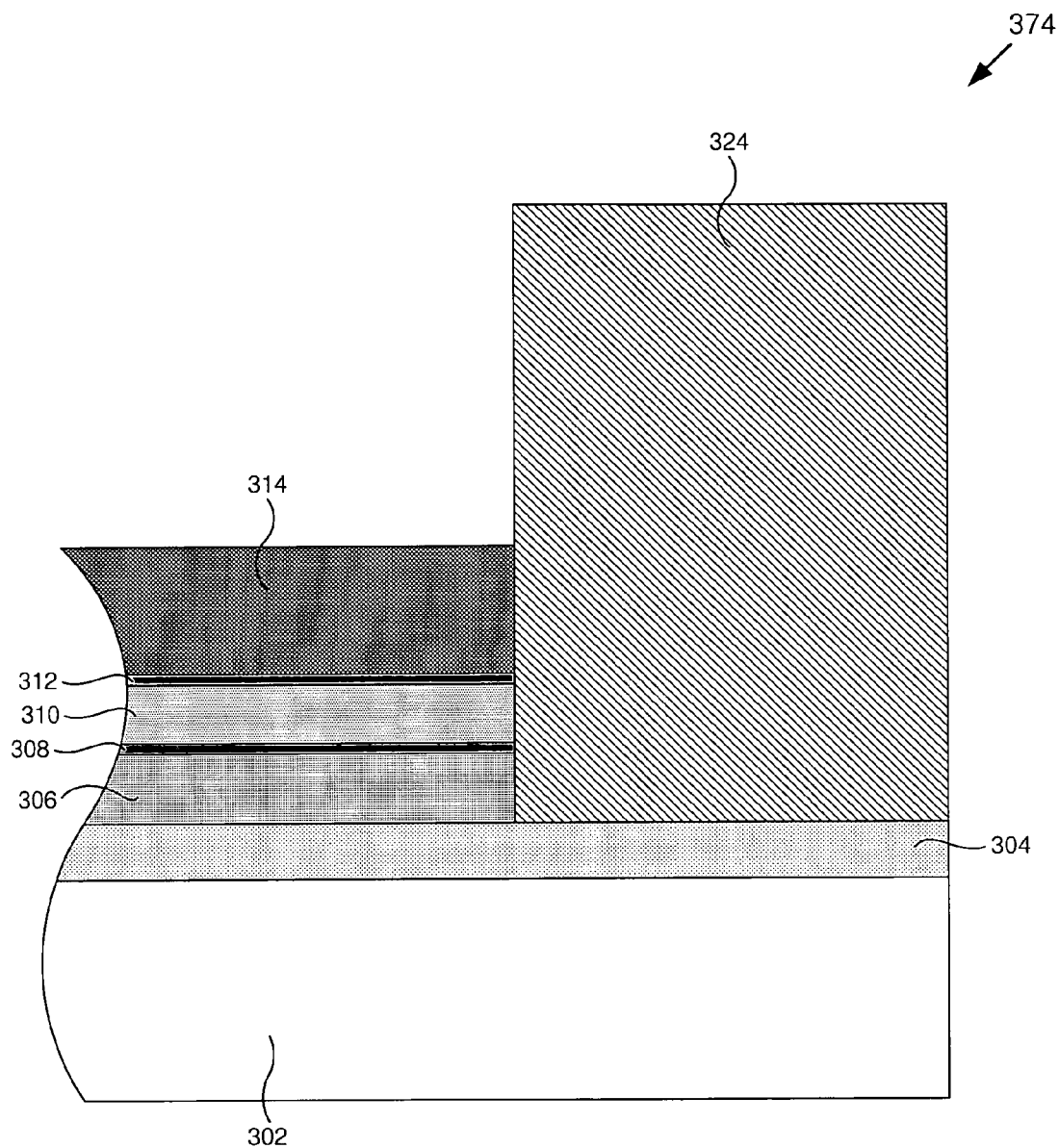
FIG. 3C illustrates a cross-sectional view, which includes a portion of a wafer processed according to an embodiment of the invention, corresponding to a final step in the flowchart in FIG. 2.

Moreover, structures 370 through 374 in FIGS. 3A through 3C illustrate the result of performing steps 270 through 274 of flowchart 200, respectively. For example, structure 370 shows a PHEMT structure after processing step 270, structure 372 shows structure 370 after the processing of step 272, structure 374 shows structure 372 after the processing of step 274. It is noted that the processing steps shown in flowchart 200 are performed on a PHEMT structure, which, prior to step 270, includes a buffer layer, a conductive channel layer situated above the buffer layer, and a spacer layer situated above the conductive channel layer. The PHEMT structure further includes a first etch stop layer situated above the spacer layer, a lightly doped layer situated above the first etch stop layer, a second etch stop layer situated above the lightly doped layer, and a heavily doped layer situated above the second etch stop layer. The PHEMT structure can be formed by sequentially growing epitaxial films or by using other methods that are known in the art. Structures 370, 372, and 374 in FIGS. 3A, 3B, and 3C illustrate the result of performing, on a PHEMT structure discussed above, steps 270, 272, and 274 of flowchart 200, respectively.

Referring to step 270 in FIG. 2 and PHEMT structure 370 in FIG. 3A, at step 270 of flowchart 200, recess 318 is formed in heavily doped layer 314, second etch stop layer 312, lightly doped layer 310, and first etch stop layer 308 of PHEMT structure 370 to expose a portion of spacer layer 306. As shown in FIG. 3A, PHEMT structure 370 includes buffer layer 302, conductive channel layer 304, spacer layer 306, first etch stop layer 308, lightly doped layer 310, second etch stop layer 312, and heavily doped layer 314. Recess 318 is formed in source/drain contact region 320 of PHEMT structure 370 and, as noted above, extends through heavily doped layer 314, second etch stop layer 312, lightly doped layer 310, and first etch stop layer 308. Recess 318 can be formed, for example, by using an appropriate etching process as known in the art. Recess 318 has depth 316 which can be between 400.0 Angstroms and 1000.0 Angstroms, for example.

As shown in FIG. 3A, buffer layer 302 can comprise, for example, GaAs (gallium arsenide) or a combination of GaAs and AlGaAs (aluminum gallium arsenide). Also shown in FIG. 3A, conductive channel layer 304 is situated above buffer layer 302 and can comprise, for example, InGaAs (indium gallium arsenide). Further shown in FIG. 3A, spacer layer 306 is situated over conductive channel layer 304 and can comprise, for example, AlGaAs. Conductive channel layer 304 can be a Schottky AlGaAs layer. Also shown in FIG. 3A, first etch stop layer 308 is situated over spacer layer 306 and can comprise AlAs (aluminum arsenide) or InGaP (indium gallium phosphide). Further shown in FIG. 3A, lightly doped layer 310 is situated over first etch stop layer 308 and can comprise lightly doped GaAs (gallium arsenide). Also shown in FIG. 3A, second etch stop layer 312 is situated over lightly doped layer 310 and can comprise AlAs or InGaP. Further shown in FIG. 3A, heavily doped layer 314 is situated over second etch stop layer 312 and can comprise heavily doped GaAs. The result of step 270 of flowchart 200 is illustrated by PHEMT structure 370 in FIG. 3A.

Referring to step 272 in FIG. 2 and PHEMT structure 372 in FIG. 3B, at step 272 of flowchart 200, metal layer 322 is formed in recess 318 in source/drain region 320 (shown in FIG. 3A). Metal layer 322 is situated on spacer layer 306 and can comprise an appropriate metal or metal stack. For example, metal layer 322 can comprise sequentially stacked layers of gold, nickel, and germanium, and gold. Metal layer 322 can be formed by sequentially depositing one or more metal layers, such as layers of gold, nickel, and germanium. The result of step 272 of flowchart 200 is illustrated by PHEMT structure 372 in FIG. 3B.

Referring to step 274 in FIG. 2 and PHEMT structure 374 in FIG. 3C, at step 274 of flowchart 200, recessed ohmic contact 324 is formed by causing the metal layer to pass through spacer layer 306 and form a bond with conductive channel layer 306, which is situated below channel layer 306. As shown in FIG. 3C, recessed ohmic contact 324 is situated on conductive channel layer 304. Recessed ohmic contact 324 can be formed, for example, by utilizing a heating process to cause the metal layer to penetrate and pass through spacer layer 306 so as to form a bond with conductive channel layer 304. The heating process can be any appropriate heating process known in the art.

Further shown in FIG. 3C, recessed ohmic contact 324 is situated adjacent to highly doped layer 314, second etch stop layer 312, lightly doped layer 310, first etch stop layer 308, and spacer layer 306. Thus, recessed ohmic contact 324 extends below heavily doped layer 314 and lightly doped layer 310. Recessed ohmic contact 324 can be either a source or drain contact. It is noted that although only one recessed ohmic contact is shown in the present application, the PHEMT structure can include two recessed ohmic contacts (i.e. source and drain recessed ohmic contacts). The result of step 274 of flowchart 200 is illustrated by PHEMT structure 374 in FIG. 3C.

Thus, as discussed above, the present invention provides a recessed ohmic contact that is formed in a recess, which is etched in heavily and lightly doped layers and two etch stop layers, and bonded to a conductive channel layer in the PHEMT structure. Since the recessed ohmic contact, which can be a source or drain ohmic contact, is bonded to the conductive channel layer in the PHEMT structure, the access resistance between the ohmic contact and the conductive channel layer is significantly reduced. As a result, the reduction in on-state resistance provides a corresponding advantageous reduction in on-state resistance.

In contrast, in known PHEMT structure 100 in FIG. 1, respective lightly and heavily doped layers 110 and 114, etch stop layers 108 and 112, and spacer layer 106 are situated between ohmic contact 116 and conductive channel layer 104, which significantly increases the access resistance between ohmic contact 116 and conductive channel layer 104. As a result, the on-state resistance in known PHEMT structure 100 is undesirably increased. Thus, by significantly reducing the access resistance between the recessed ohmic contact and the conductive channel layer, the present invention advantageously achieves a PHEMT structure having a lower on-state resistance compared to known PHEMT structure 100.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a PHEMT structure having a recessed ohmic contact and method for fabricating same have been described.

The invention claimed is:

1. A pseudomorphic high electron mobility transistor structure comprising:
   a conductive channel layer;
   a spacer layer situated over said conductive channel layer and in contact with said conductive channel layer;
   a first etch stop layer situated over said spacer layer and in contact with said spacer layer;
   a first doped layer situated over said first etch stop layer and in contact with said first etch stop layer;
   a second etch stop layer situated over said first doped layer and in contact with said first doped layer;
   a second doped layer situated over said second etch stop layer and in contact with said second etch stop layer;
   at least one metal layer situated on said spacer layer and formed in an opening in said second doped layer, said opening extending through said second doped layer, said second etch stop layer, said first doped layer, and said first etch stop layer, and terminating above said conductive channel layer; and
   a metal-semiconductor alloy layer ohmically contacting said at least one metal layer and said conductive channel layer.

2. The pseudomorphic high electron mobility transistor structure of claim 1 wherein said metal-semiconductor alloy layer is bonded to said conductive channel layer.

3. The pseudomorphic high electron mobility transistor structure of claim 1 wherein said at least one metal layer is situated laterally adjacent to said second doped layer, said second etch stop layer, said first doped layer, and said first etch stop layer.

4. The pseudomorphic high electron mobility transistor structure of claim 1 wherein said first doped layer is formed from a same material as said second doped layer, and wherein said second doped layer is more highly doped than said first doped layer.

5. The pseudomorphic high electron mobility transistor structure of claim 1 wherein said conductive channel layer comprises indium gallium arsenide.

6. The pseudomorphic high electron mobility transistor structure of claim 1 wherein said spacer layer comprises aluminum gallium arsenide.

7. The pseudomorphic high electron mobility transistor structure of claim 6 wherein said spacer layer is a Schottky layer.

8. The pseudomorphic high electron mobility transistor structure of claim 1 wherein said at least one metal layer comprises gold, nickel, and germanium.

9. The pseudomorphic high electron mobility transistor structure of claim 1 wherein said second doped layer comprises gallium arsenide.

10. The pseudomorphic high electron mobility transistor structure of claim 1 wherein said at least one metal layer and said metal-semiconductor alloy layer are formed in at least one of a source area and a drain area of said pseudomorphic high electron mobility transistor structure.

11. The pseudomorphic high electron mobility transistor structure of claim 1 wherein said first etch stop layer is formed from a compound selected from the group consisting of aluminum arsenide and indium gallium phosphide.

12. The pseudomorphic high electron mobility transistor structure of claim 1 wherein said second etch stop layer is formed from a compound selected from the group consisting of aluminum arsenide and indium gallium phosphide.

13. The pseudomorphic high electron mobility transistor structure of claim 1 wherein said metal-semiconductor alloy extends into said conductive channel layer but not through said conductive channel layer.

14. The pseudomorphic high electron mobility transistor structure of claim 1 wherein a resistance between said at least one metal layer and said conductive channel layer is reduced by not including said first etch stop layer, said first doped layer, said second etch stop layer, and said second doped layer in a conductive path between said at least one metal layer and said conductive channel layer.

15. The pseudomorphic high electron mobility transistor structure of claim 1 wherein said first doped layer comprises gallium arsenide.

16. The pseudomorphic high electron mobility transistor structure of claim 1 further comprising a buffer layer aligned beneath said conductive channel layer, said buffer layer being formed from a material selected from the group consisting of gallium arsenide and a mixture of gallium arsenide and aluminum gallium arsenide.

* * * * *